United States Patent
Tseng

(10) Patent No.: US 6,265,285 B1
(45) Date of Patent: Jul. 24, 2001

(54) METHOD OF FORMING A SELF-ALIGNED TRENCH ISOLATION

(75) Inventor: Horng-Huei Tseng, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/696,608

(22) Filed: Oct. 25, 2000

(51) Int. Cl.$^7$ .................................................. H01L 21/76
(52) U.S. Cl. .......................... 438/424; 257/374; 438/296
(58) Field of Search ................................. 257/374, 510; 438/218, 296, 424, 435, 437

(56) References Cited

U.S. PATENT DOCUMENTS

| | | | | |
|---|---|---|---|---|
| 5,433,794 | * | 7/1995 | Fazan et al. ........................ | 148/33.3 |
| 5,679,599 | * | 10/1997 | Mehta ................................ | 438/425 |
| 5,741,738 | * | 4/1998 | Mandelman et al. ............... | 438/296 |
| 5,895,253 | * | 4/1999 | Akram ............................... | 438/424 |
| 5,918,131 | * | 6/1999 | Hsu et al. .......................... | 438/296 |
| 5,953,621 | * | 9/1999 | Gonzalez et al. .................. | 438/424 |
| 6,074,932 | * | 6/2000 | Wu .................................... | 438/435 |
| 6,084,276 | * | 7/2000 | Gambino et al. .................. | 257/397 |
| 6,097,076 | * | 8/2000 | Gonzalez et al. .................. | 257/513 |
| 6,165,871 | * | 12/2000 | Lim et al. .......................... | 438/437 |
| 6,207,532 | * | 3/2001 | Lin et al. ........................... | 438/424 |

OTHER PUBLICATIONS

Takeuchi et al., A self-aligned STI process integration for low cost and highly reliable 1 Gbit flash memories, Dig. of Tech. Papers Symp. on VLSI Tech, Jun. 1998, pp. 102–103.*

* cited by examiner

Primary Examiner—Richard Elms
Assistant Examiner—Christan D. Wilson
(74) Attorney, Agent, or Firm—Thomas, Kayden, Horstemeyer & Risley

(57) ABSTRACT

A method of forming a self-aligned trench isolation comprises forming a silicon film on a pad oxide that is grown upon a semiconductor substrate, and then etching the silicon film to expose the pad oxide and form a first opening. A poly-oxide is grown up by thermal process to cover on the silicon film and form a second opening with a width smaller than that of the first opening, and then the poly-oxide is etched back to form a poly-oxide spacer. In the formation of the poly-oxide spacer, the pad oxide is also etched to expose the semiconductor substrate. After a trench is formed into the semiconductor substrate through the second opening, a dielectric film is deposited and filled in the trench, and then etched back to expose the silicon film and leave the portion of the dielectric film inside the trench. The silicon film is then removed to form the resultant trench isolation.

12 Claims, 4 Drawing Sheets

METHOD OF FORMING A SELF-ALIGNED TRENCH ISOLATION

FIELD OF THE INVENTION

The present invention relates generally to the manufacture of a trench isolation in a semiconductor device, and more particularly, to a method of forming a trench isolation for a semiconductor device in combination with a poly-oxide spacer process and a self-aligned trench process.

BACKGROUND OF THE INVENTION

The trench isolation structure and process is important for the manufacture of a semiconductor device to isolate microelectronic devices in the semiconductor device. For the microelectronic devices to be placed increasing closer to each other without causing detrimental electronic interaction such as unwanted capacitance build-up and current leakage, advanced trench isolation structure and process is desired.

In a conventional trench isolation, an isolation trench is formed in a semiconductor substrate and then filled up with an isolation material, and the active area of the semiconductor substrate is covered with a pad oxide thereon. However, the isolation material in the isolation trench exhibits a non-planarity at the top surface thereof between corners due to dissimilarity of etch rates between the isolation material and pad oxide. A problem that is inherent in such non-planarity of fill material within an isolation trench is that the corners may leave the active area of the semiconductor substrate exposed. As a result, the isolation material will not prevent layers formed thereon contacting the active area of the semiconductor substrate at the corners, which is detrimental in that it causes charge and current leakage. The isolation material is also unable to prevent unwanted thermal oxide encroachment through the corners into the active area of the semiconductor substrate.

Gonzalez et al. disclose a self-aligned isolation trench and a method of forming such an isolation trench structure without causing deleterious topographical depressions in upper surface thereof which cause current and charge leakage to an adjacent active area, respectively in U.S. Pat. Nos. 6,097,076 and 5,953,621. These prior arts form a nitride layer on the pad oxide which is grown upon a semiconductor substrate. After patterning the nitride layer to expose a portion of the pad oxide layer, a second dielectric layer is formed substantially conformably over the pad oxide layer and the remaining portions of a first dielectric layers. A spacer is formed from the second dielectric layer, and then an isolation trench is etched into the semiconductor substrate. A conformal layer is formed substantially conformably over the spacer and the remaining portions of the first dielectric layer, and substantially filling in the isolation trench. After planarization of the conformal layer, the resulting structure has a flange and shaft, the cross section of which has a nail shape in its cross section.

However, even though Gonzalez et al. improve the trench isolation by the above-described arts, the method of forming the isolation trench is still complicated. It is therefore desired a further improvement for the trench isolation process over the method provided by Gonzalez et al.

SUMMARY OF THE INVENTION

An object of the present invention is to provide a method of forming a trench isolation on a semiconductor substrate without causing deleterious topographical depressions in the upper surface of the fill dielectric material in the isolation trench, while substantially preventing contact between the layers overlying the fill dielectric material of the isolation trench and the active area of the semiconductor substrate.

According to the present invention, a method of forming a trench isolation comprises depositing a silicon film upon a pad oxide that covers on a semiconductor substrate and then patterning the silicon film to expose the pad oxide and form a first opening. The silicon film is substantially thermally oxidized to form a poly-oxide layer on its surface, and a second opening is thus formed between the poly-oxides on the sidewalls of the silicon film. A directional etch is applied to the poly-oxide layer and pad oxide to form a poly-oxide spacer and expose the semiconductor substrate. A plasma etch is used through the second opening to form an isolation trench in the semiconductor substrate. A dielectric film is deposited and fills in the isolation trench. The portions of the dielectric film covered on the top planar portions of the silicon film is substantially removed to expose the silicon film by a chemical mechanical polishing (CMP) process. Then the silicon film is removed to leave a trench isolation structure with a nail shape in its cross section on the semiconductor substrate.

Thus the process of forming a trench isolation on a semiconductor substrate becomes simpler and the width of the isolation trench can be made narrower.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
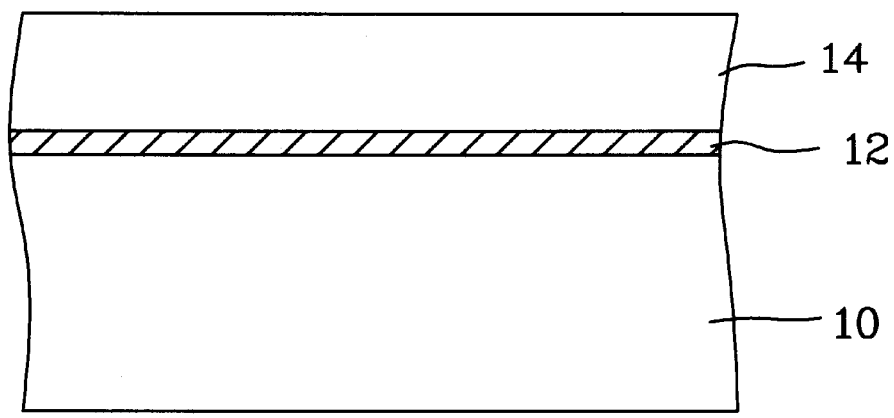
FIG. 1 is a cross-sectional view of a semiconductor substrate with a pad oxide and a silicon film deposited thereon.

A starting structure for one embodiment of the present invention is shown in FIG. 1, in which a pad oxide 12 in a thickness of about 100–800 A is grown upon a semiconductor substrate 10 and a silicon film 14 is deposited on the pad oxide 12. The silicon film 14 can be composed of polycrystalline silicon or amorphous silicon with a thickness ranged from 1,000 to 3,000 A.

Figure 2:
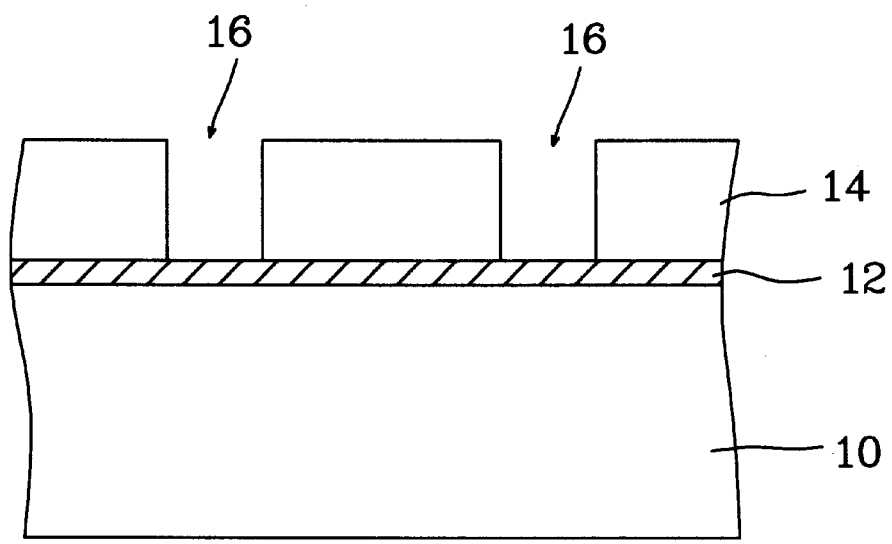
FIG. 2 is a cross-sectional view of the structure with the silicon film shown in FIG. 1 being patterned and selectively etched to form first openings and thus expose the pad oxide.
Figure 3:
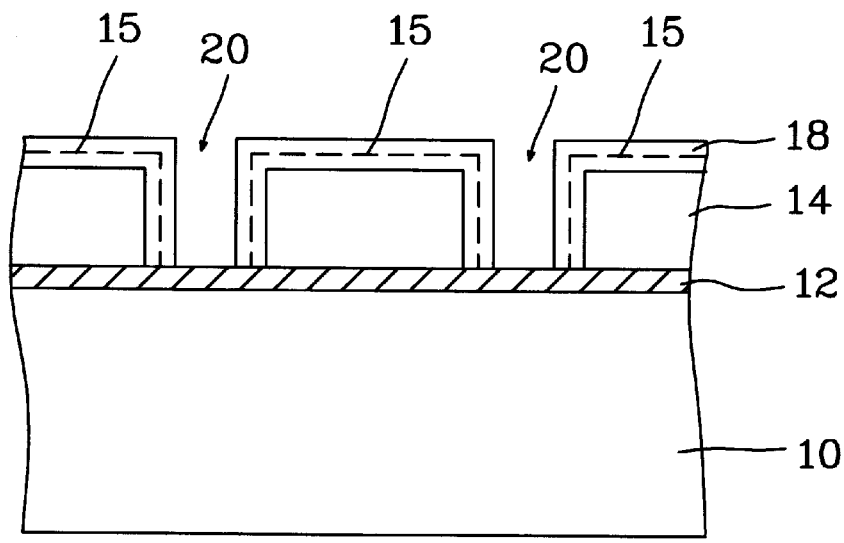
FIG. 3 is a cross-sectional view of a poly-oxide formation on the surface of the silicon film substantially from the structure shown in FIG. 2.

In FIG. 2, the silicon film 14 is patterned by lithography and plasma etch process to expose the pad oxide 12 and thus form first openings 16. Then the silicon film 14 is thermally oxidized to form a poly-oxide layer 18 on its surface, as shown in FIG. 3. The dashed line 15 in FIG. 3 represents the original boundary of the silicon film 14 before it is oxidized. Second openings 20 are thus formed between the poly-oxide 18 and have a width smaller than that of the first opening 16, since the poly-oxide 18 is grown up in both outward and inward directions from the original boundary 15 of the silicon film 14 and thus takes up the lateral space into the first opening 16.

Figure 4:
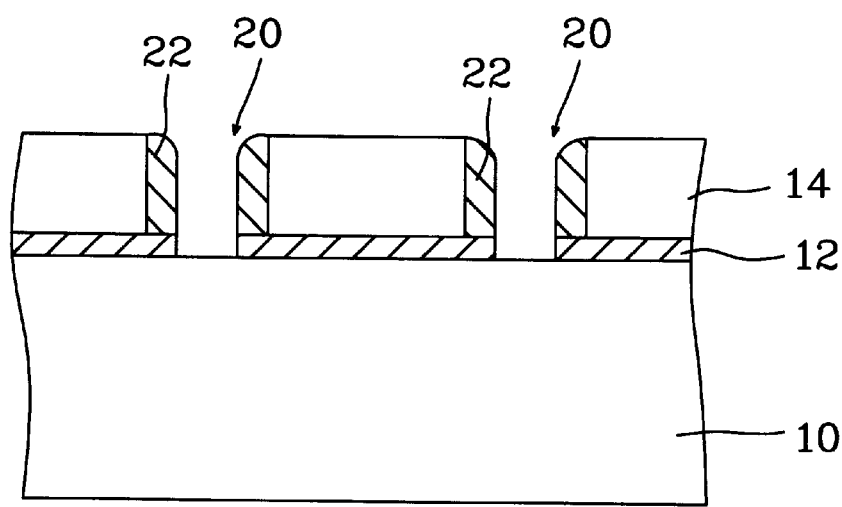
FIG. 4 is a cross-sectional view of the structure after poly-oxide layer shown in FIG. 3 is partially etched to form poly-oxide spacers on the sidewalls of the silicon film and second openings between the poly-oxide spacers.

The poly-oxide layer 18 is then partially etched, as shown in FIG. 4. A directional etch process is used to remove the portions of the poly-oxide layer 18 covered on the silicon film 14 and leave the portions of the poly-oxide layer 18 on the sidewalls of the silicon film 14 to form poly-oxide spacers 22 between the silicon film 14. The pad oxide 12 is also partially removed through the second openings 20 in the etch process to expose the semiconductor substrate 10.

Figure 5:
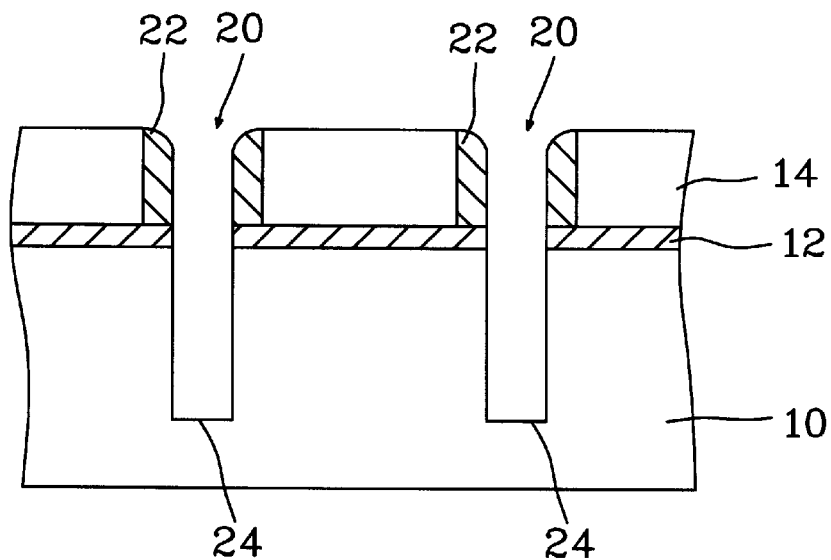
FIG. 5 is a cross-sectional view when isolation trenches are formed through the second openings into the semiconductor substrate substantially from the structure shown in FIG. 4.

Following the formation of the poly-oxide spacers 22, isolation trenches 24 are formed by for example plasma etching the semiconductor substrate 10 through the second openings 20, as shown in FIG. 5. The trench 24 is extended below the pad oxide 12 into the semiconductor substrate 10 and has a width determined by the width of the second openings 20. It is noted that the isolation trench 24 can be made more narrower than in the prior art, since the poly-oxide spacer 22 is formed from the silicon film 14 by thermal oxidation and the second opening 20 thus formed is smaller than the original opening 16 determined by lithography as described in the above and shown in FIG. 3.

Figure 6:
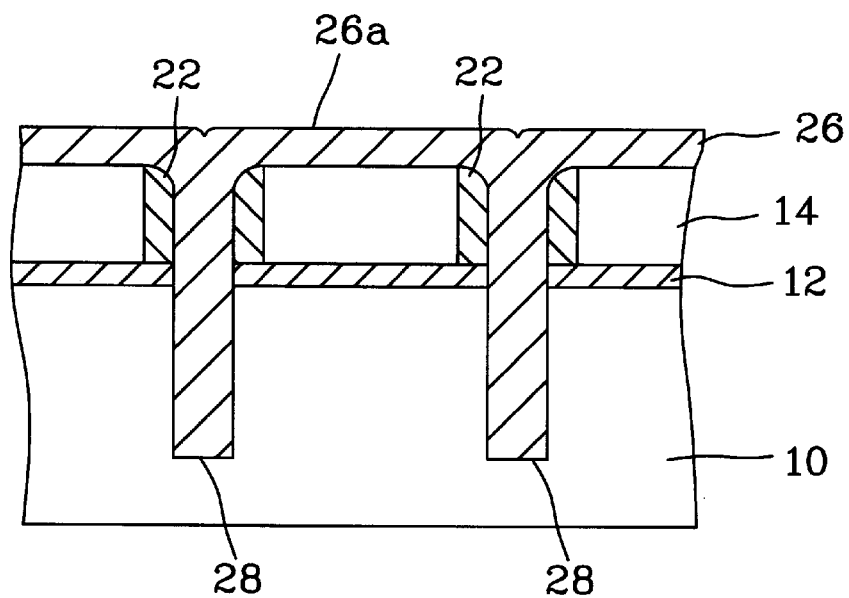
FIG. 6 is a cross-sectional view after a dielectric film is deposited and thus filled in the isolation trenches of the structure shown in FIG. 5.

Then a dielectric film 26 such as a silicon dioxide ($SiO_2$) is deposited, as shown in FIG. 6, by which the isolation trenches 24 and second openings 20 are filled up with the dielectric film 26. The dielectric film 26 can be formed for example by decomposition of Tetra-Ethyl-Ortho-Silicate (TEOS). Optionally, a liner (not shown) can be formed on the sidewalls of the isolation trench 24 before it is filled with the dielectric film 26. Moreover, a doped region (not shown) can be formed under the bottom of the isolation trench 24 by ion implantation. These two optional steps are both well known to those skilled in the art.

Figure 7:
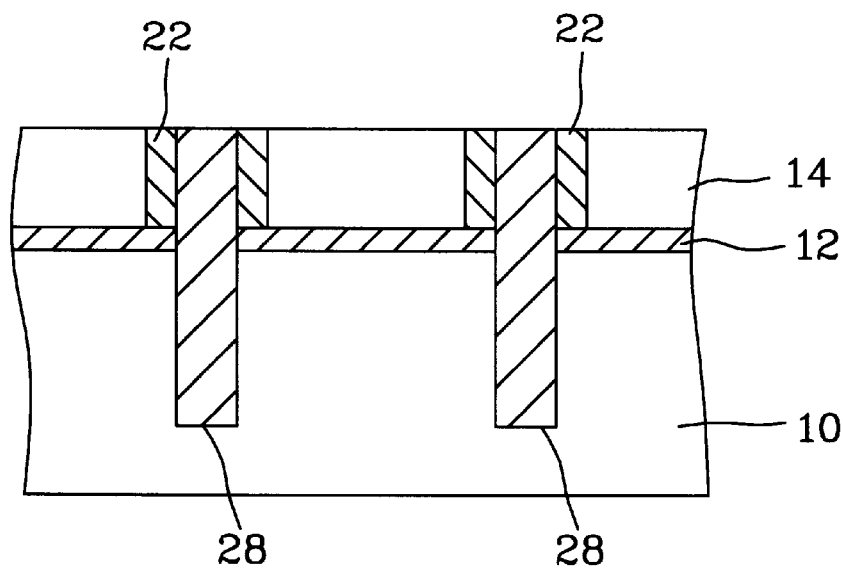
FIG. 7 is a cross-sectional view of the structure after the dielectric film shown in FIG. 6 is etched back to expose the silicon film.

As shown in FIG. 7, the dielectric film 26 is etched back by such as CMP process with the silicon film 14 as a etch stop layer to leave the portions of the dielectric film 28 inside the trenches 24. As a result, the silicon film 14 is exposed again and a planarized top surface is also obtained. If a silicon dioxide is used for the dielectric film 26, the silicon dioxide 28 and poly-oxide spacer 22 can be optionally fused together by heat treatment and made denser by a further thermal process, such as rapid thermal processing (RTP).

Figure 8:
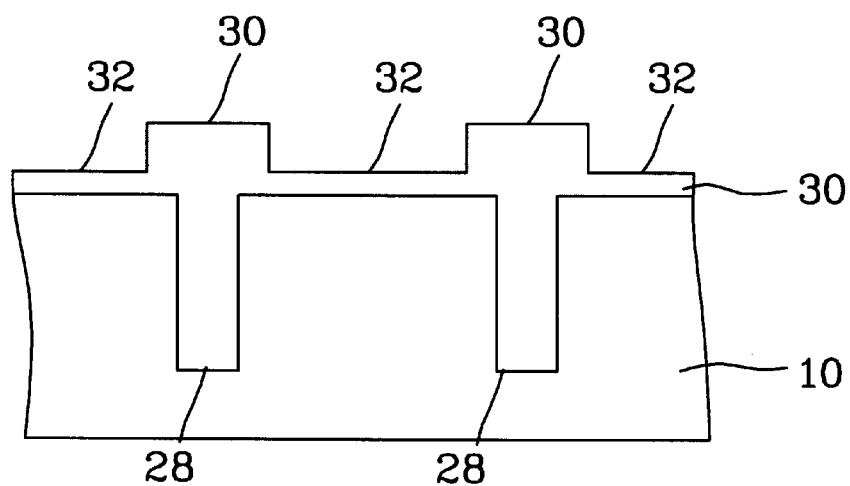
FIG. 8 is a cross-sectional view of the resultant trench isolation structure after the silicon film shown in FIG. 7 is removed.

The silicon film 14 is removed by dry etching or wet etching process, and the resultant structure is shown in FIG. 8. The trench isolation 28 has a nail shape in its cross section with a flange 30 at its upper side. The flange 30 of the trench isolation 28 partially covers the edge of the active area adjacent to the trench isolation 28. Now the pad oxide 12 shown in the above drawings can be optionally removed away and replaced with a gate oxide 32 grown upon the semiconductor substrate 10 at its top surface between the trench isolations 28.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A method of forming a self-aligned trench isolation on a semiconductor substrate with a pad oxide thereon, the method comprising the steps of:

depositing a silicon film on said pad oxide;

selectively removing said silicon film to expose said pad oxide, leave a residue silicon film, and form a first opening in said residue silicon film;

forming a poly-oxide layer covered on said residue silicon film and a second opening between said poly-oxide layer;

selectively removing said poly-oxide layer and pad oxide to form a poly-oxide spacer and expose said semiconductor substrate through said second opening;

forming a trench extending into said semiconductor substrate through said second opening;

depositing a dielectric film to fill in said trench and second opening;

selectively removing said dielectric film to expose said residue silicon film; and removing said residue silicon film.

2. A method according to claim 1, wherein said silicon film is a polycrystalline silicon.

3. A method according to claim 1, wherein said silicon film is an amorphous silicon.

4. A method according to claim 1, wherein said first opening is formed by plasma etch.

5. A method according to claim 1, wherein said poly-oxide layer is formed by thermally oxidizing said residue silicon film.

6. A method according to claim 1, wherein said poly-oxide spacer is formed by directional etch.

7. A method according to claim 1, wherein said trench is formed by plasma etch.

8. A method according to claim 1, wherein said dielectric film is a silicon dioxide.

9. A method according to claim 1, wherein said dielectric film is etched back by CMP.

10. A method according to claim 1, wherein said residue silicon film is removed by dry etch.

11. A method according to claim 1, wherein said residue silicon film is removed by wet etch.

12. A method according to claim 1 further comprising the steps of:

removing said pad oxide; and forming a gate oxide on said semiconductor substrate.

* * * * *